(12) United States Patent
Jung

(10) Patent No.: US 9,269,756 B2
(45) Date of Patent: Feb. 23, 2016

(54) ORGANIC LIGHT EMITTING DISPLAY APPARATUS

(71) Applicant: SAMSUNG DISPLAY CO., LTD., Yongin, Gyeonggi-Do (KR)

(72) Inventor: Kyu-Bong Jung, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/073,765

(22) Filed: Nov. 6, 2013

(65) Prior Publication Data

US 2015/0028293 A1    Jan. 29, 2015

(30) Foreign Application Priority Data

Jul. 24, 2013    (KR) .......................... 10-2013-0087612

(51) Int. Cl.
*H01L 21/00*    (2006.01)
*H01L 27/32*    (2006.01)

(52) U.S. Cl.
CPC .................................. *H01L 27/3276* (2013.01)

(58) Field of Classification Search
CPC .................................................. H01L 27/3276
USPC ....................... 257/39–40; 345/204
See application file for complete search history.

(56) References Cited

U.S. PATENT DOCUMENTS

2009/0096069 A1    4/2009 Ishimaru et al.
2009/0167730 A1*   7/2009 Kwak et al. .................... 345/204

FOREIGN PATENT DOCUMENTS

| KR | 10-2006-0079694 A | 7/2006 |
| KR | 10-2007-0075356 A | 7/2007 |
| KR | 10-2008-0002336 A | 1/2008 |
| KR | 10-2009-0037333 A | 4/2009 |
| KR | 10-2009-0072393 A | 7/2009 |
| KR | 10-2009-0082640 A | 7/2009 |
| KR | 10-2010-0023739 A | 3/2010 |

* cited by examiner

*Primary Examiner* — Laura Menz
(74) *Attorney, Agent, or Firm* — Lewis Roca Rothgerber Christie LLP

(57) ABSTRACT

An organic light emitting display apparatus capable of reducing a dead space for arranging wirings in a panel. The organic light emitting display apparatus includes: a panel including a screen portion on which images are displayed and a non-screen portion surrounding the screen portion; a first wiring portion and a second wiring portion formed on different locations of the non-screen portion to be connected to pixel wirings on the screen portion; and a film substrate including a plurality of connection portions connected to the first wiring portion and the second wiring portion. Thus, the dead space that is formed on the non-screen portion of the panel for forming the wirings may be effectively reduced.

11 Claims, 6 Drawing Sheets

ORGANIC LIGHT EMITTING DISPLAY APPARATUS

CROSS-REFERENCE TO RELATED APPLICATION

This application claims priority to and the benefit of Korean Patent Application No. 10-2013-0087612, filed on Jul. 24, 2013, in the Korean Intellectual Property Office, the entire content of which is incorporated herein by reference.

BACKGROUND

1. Field

One or more embodiments of the present invention relate to an organic light emitting display apparatus, and more particularly, to an organic light emitting display apparatus having an improved structure capable of reducing a dead space for wiring on a panel.

2. Description of the Related Art

In general, an organic light emitting display apparatus has a structure in which an emission layer formed of an organic layer is disposed between an anode and a cathode. When voltages are applied to the anode and the cathode, holes injected from the anode and electrons injected from the cathode are recombined in the emission layer to generate excitons, and light is emitted and thus images are displayed while excitons drop from an excited state to a ground state.

For performing such operations, wirings are provided for connecting the electrodes to electric power in the organic light emitting display apparatus, and such wirings are disposed on a dead space that is outside of a display panel and shielded by a black matrix (or dark layer).

However, when a space occupied by the wirings on the display panel is increased, a screen (screen portion i.e., area for displaying images) has to be reduced in size. Thus, a method of effectively reducing the dead space occupied by the wiring is necessary in order to realize (or achieve) a large size screen.

SUMMARY

Aspects of one or more embodiments of the present invention are directed toward an organic light emitting display apparatus having an improved structure for reducing a dead space occupied by wirings on an outside of a screen.

Additional aspects will be set forth in part in the description which follows and, in part, will be apparent from the description, or may be learned by practice of the presented embodiments.

According to one or more embodiments of the present invention, an organic light emitting display apparatus includes: a panel including a screen portion on which images are displayed and a non-screen portion surrounding the screen portion; a first wiring portion and a second wiring portion on different locations of the non-screen portion, each configured to be connected to pixel wirings on the screen portion; a film substrate including a plurality of connection portions configured to be connected to the first wiring portion and the second wiring portion; and a main board for connecting the film substrate to an electric power.

The first wiring portion may be connected to the pixel wirings formed at a first side portion of the screen portion, and the second wiring portion may be connected to the pixel wirings at a second side portion of the screen portion separated from the first side of the screen portion.

The pixel wirings may include gate lines via which a scan signal to each of a plurality of pixels in the screen portion is applied.

The pixel wirings may further include data lines and driving power lines configured to be connected to the film substrate, not through the first wiring portion and the second wiring portion, to apply a data signal and a driving power signal to each of the pixels.

The first wiring portion and the second wiring portion respectively may include a first pad portion and a second pad portion configured to be connected to the connection portions of the film substrate, and the first pad portion and the second pad portion may be located at opposite sides of the screen portion.

The first pad portion and the second pad portion may be on a first surface of the panel, in which the screen portion is seen, and the film substrate may be attached to a second surface of the panel facing oppositely away from the first surface.

The first wiring portion and the second wiring portion may be on a first surface of the panel, in which the screen portion is seen, and the film substrate may be attached to the non-screen portion of the panel on the first surface and configured to be connected to the first wiring portion and the second wiring portion via the connection portions.

A third wiring portion and a fourth wiring portion configured to be connected to the connection portions of the film substrate may be further formed on the first surface of the panel.

The pixel wirings may include gate lines configured to be connected to the first wiring portion and the second wiring portion to apply scan signals to pixels in the screen portion, data lines configured to be connected to the third wiring portion to apply data signals to the pixels, and driving power lines configured to be connected to the fourth wiring portion to apply driving voltage signals to the pixels.

A driving chip may be mounted on the film substrate. A driving component selected from a resistor and a capacitor may be further mounted on the film substrate.

The panel may be formed in one of a square shape and a circular shape.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
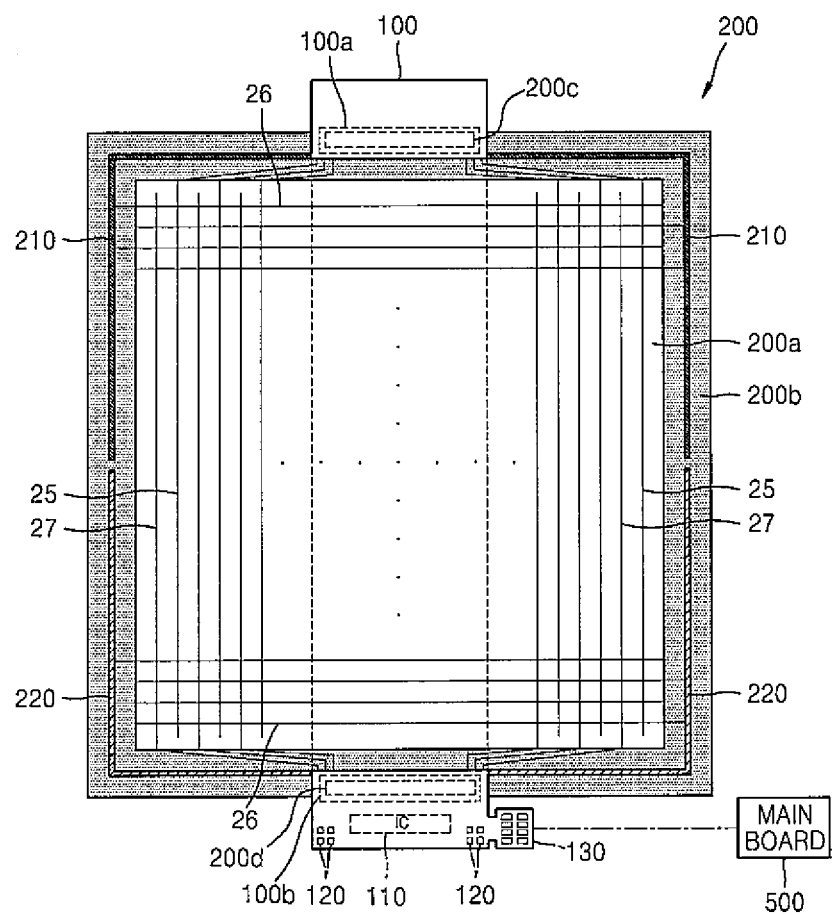
FIG. 1 is a plan view of an organic light emitting display apparatus according to an embodiment of the present invention.

Hereinafter, embodiments of the present invention will be described in more detail by explaining embodiments of the invention with reference to the attached drawings. Like reference numerals in the drawings denote like elements. In the following description of the present invention, a detailed description of known functions and configurations incorporated herein will not be repeated when it may make the subject matter of the present invention unclear.

In the drawings, the thicknesses of layers and regions are exaggerated for clarity. It will be understood that when a layer is referred to as being "on" an other layer or substrate, it can be directly on the other layer or substrate, or intervening layers may also be present. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the present invention refers to "one or more embodiments of the present invention."

Figure 2:
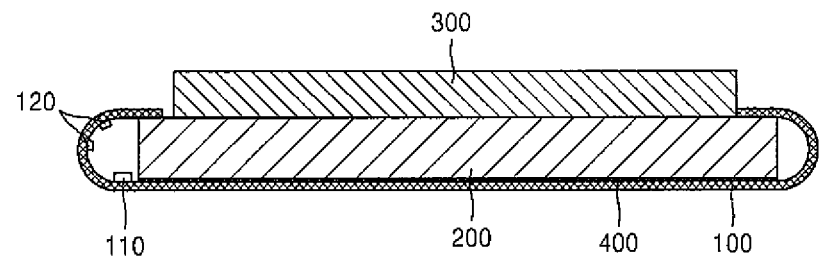
FIG. 2 is a side view of the organic light emitting display apparatus of FIG. 1.
Figure 3:
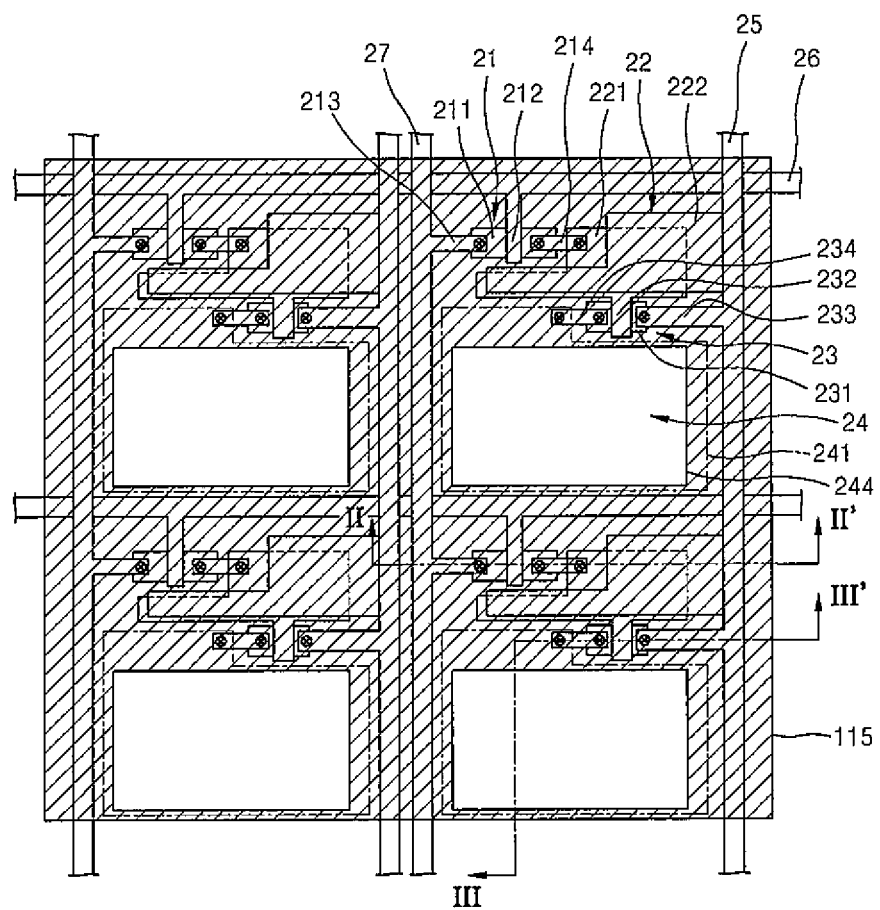
FIG. 3 is a partially expanded plan view of some pixels on a screen according to an embodiment of the present invention.
Figure 4:
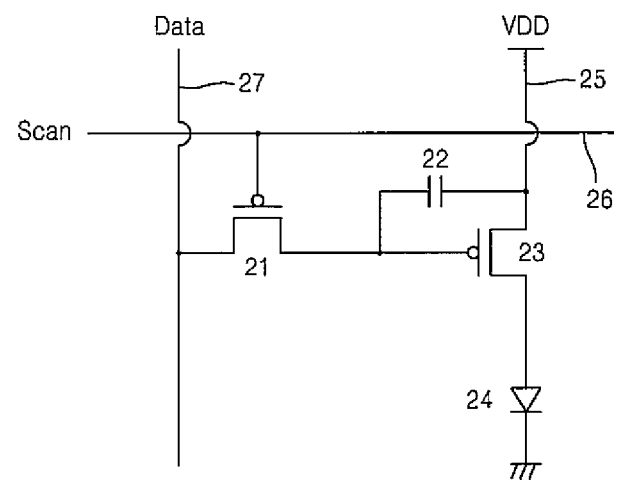
FIG. 4 is an equivalent circuit diagram of a pixel.

FIG. 1 is a plan view of an organic light emitting display apparatus according to an embodiment of the present invention, FIG. 2 is a side view of the organic light emitting display apparatus of FIG. 1, FIG. 3 is a partially expanded plan view of some pixels in a screen portion 200a according to the present embodiment of the present invention, and FIG. 4 is an equivalent circuit diagram of a pixel.

Referring to FIGS. 1 and 2, the organic light emitting display apparatus according to the present embodiment includes a panel 200 including the screen portion 200a on which images are displayed and a non-screen portion 200b surrounding the screen portion 200a, and a film substrate 100 attached to the panel 200 with a protection tape 400 therebetween, in order to electrically connect a main board 500 to the panel 200 to each other.

A plurality of pixels are formed on the screen portion 200a, and pixel wirings via which electrical signals are applied to the pixels are formed on the screen portion 200a. The pixel wirings may include gate lines 26 for applying scan signals to the pixels, data lines 27 for applying data signals to the pixels, and driving power lines 25 via which driving voltage signals are applied to the pixels. Detailed structures of the pixel wirings will be described later.

In addition, the non-screen portion 200b is a region blocked by (or hidden under) a black matrix (or a dark layer). The non-screen portion 200b includes a first wiring portion 210 and a second wiring portion 220 for connecting to the pixel wirings. The first wiring portion 210 is formed on an upper portion of the panel 200, as shown in FIG. 1, and the second wiring portion 220 is formed on a lower portion of the panel 200 so that the pixel wirings of the screen portion 200a may be split into two portions to be connected. That is, the first wiring portion 210 is connected to the pixel wirings on the upper portion of the screen portion 200a, and the second wiring portion 220 is connected to the pixel wirings on the lower portion of the screen portion 200a, as shown in FIG. 1. Here, from among the pixel wirings, the gate lines 26 are each connected to the first or second wiring portions 210 and 220.

Also, a first pad portion 200c and a second pad portion 200d that are respectively connected to the first and second wiring portions 210 and 220 are located on two opposite facing sides of the non-screen portion 200b of the panel 200, and a first connection portion 100a and a second connection portion 100b located on the film substrate 100 are respectively connected to the first and second pad portions 200c and 200d. That is, the film substrate 100 and the first and second wiring portions 210 and 220 are connected to each other by connections between the first and second pad portions 200c and 200d and the first and second connection portions 100a and 100b. In addition, from among the pixel wirings, the data lines 27 and the driving power lines 25 are directly connected to the first and second pad portions 200c and 200d, not via the first and second wiring portions 210 and 220. The driving power lines 25 are connected to the first pad portion 200c, and the data lines 27 are connected to the second pad portion 200d. That is, the driving power lines 25 and the data lines 27 are connected to the film substrate 100 by the connections between the first and second pad portions 200c and 200d and the first and second connection portions 100a and 100b.

The film substrate 100 is attached to a rear surface of the panel 200 with the protection tape 400, as shown in FIG. 2, and the first and second connection portions 100a and 100b located at opposite ends of the film substrate 100 are bent toward a front surface of the panel 200 to be connected to the first and second pad portions 200c and 200d. That is, in a state where the first and second pad portions 200c and 200d are formed on a first surface of the panel 200, in which the screen portion 200a is seen, and the film substrate 100 is attached to an opposite surface, that is, a second surface of the panel 200, the first and second connection portions 100a and 100b located at the two opposite ends of the film substrate 100 are bent toward the first surface and connected to the first and second pad portions 200c and 200d. As such, the main board 500 and the first and second pad portions 200c and 200d are connected via the film substrate 100, and consequently, the main board 500 is connected to the gate lines 26 via the first and second wiring portions 210 and 220, and connected to the data lines 27 and the driving power lines 25 that are directly connected to the first and second pad portions 200c and 200d. In addition, a driving chip 110 connected to the main board 500 is mounted on the film substrate 100, and driving components 120, such as a resistor or a capacitor, are mounted on the film substrate 100. Therefore, the film substrate 100 may be connected to the main board 500 via a connector 130 without interposing an additional flexible printed circuit (FPC) on which the driving chip 110 or the driving components 120 would be mounted between the film substrate 100 and the main board 500. The main board 500 connects a power source to the film substrate 100. In FIG. 2, the reference numeral 300 denotes a window provided on the panel 200, and the window 300 is not shown in FIG. 1 for convenience of description.

According to the above structure, since the film substrate 100 and the panel 200 are connected to each other via a plurality of connecting points, that is, the first and second connection portions 100a and 100b and the first and second pad portions 200c and 200d, the first and second wiring portions 210 and 220 connected to the pixel wirings may be arranged into two split or separate regions. Thus, the regions of the first and second wiring portions 210 and 220 do not overlap with each other, and thus, a width of the non-screen portion 200b occupied by the first and second wiring portions 210 and 220 on a plane or surface may be reduced. Here, although FIG. 1 shows the first and second wiring portions 210 and 220 simply as single wires, a plurality of lines connected to the gate lines 26 are actually arranged in one embodiment. Thus, when the number of gate lines 26 to be connected increases, the width of the region occupied by the first and second wiring portions 210 and 220 in the non-screen portion 200b increases. However, as described above, when the first wiring portion 210 and the second wiring portion 220 are separately located on one side (portion) and the other side (portion) of the panel 200, the width of the area occupied by the first and second wiring portions 210 and 220 may be reduced. Thus, the width of the non-screen portion 200b may be effectively reduced, and the screen portion 200a may be realized as a large size screen. Also, since the driving power lines 25 and the data lines 27 are separately connected to the first pad portion 200c and the second pad portion 200d, the width of the non-screen portion 200b may be further reduced.

Hereinafter, an internal structure of the screen portion 200a in which the pixel wirings are arranged will be described in more detail.

A plurality of pixels, as shown in FIG. 3, are formed in the screen portion 200a, and FIG. 4 is an equivalent circuit diagram of a pixel.

As shown in FIGS. 3 and 4, each pixel includes at least two thin film transistors (TFTs) (that is, a first thin film transistor (TFT) 21 for switching and a second TFT 23 for driving), a capacitor 22, and an organic light emitting device (OLED) 24. The number of TFTs and capacitors is not limited to the above example, that is, more TFTs and more capacitors may be formed.

The first TFT 21 is driven by a scan signal applied to the gate line 26 to transfer a data signal applied to the data line 27 to the second TFT 23.

The second TFT 23 determines an amount of current provided to the OLED 24 according to the data signal transferred from the first TFT 21, that is, a voltage difference Vgs between a gate and a source.

The capacitor 22 stores the data signal transferred from the first TFT 21 for one frame.

A stacked structure of the first and second TFTs 21 and 23, the OLED 24, and the capacitor 22 are described with reference to FIGS. 3, 5, and 6. Here, FIG. 5 is a cross-sectional view taken along the line II-II' of FIG. 3, and FIG. 6 is a cross-sectional view taken along the line III-III' of FIG. 3.

Figure 5:
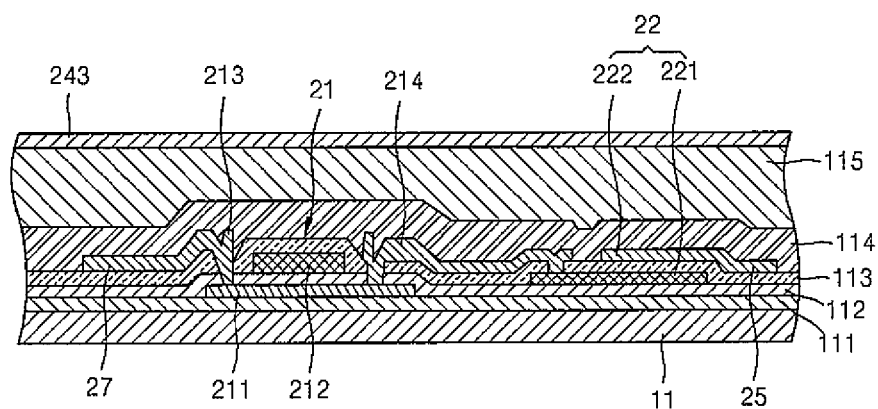
FIG. 5 is a cross-sectional view taken along line II-II' of FIG. 3.
Figure 6:
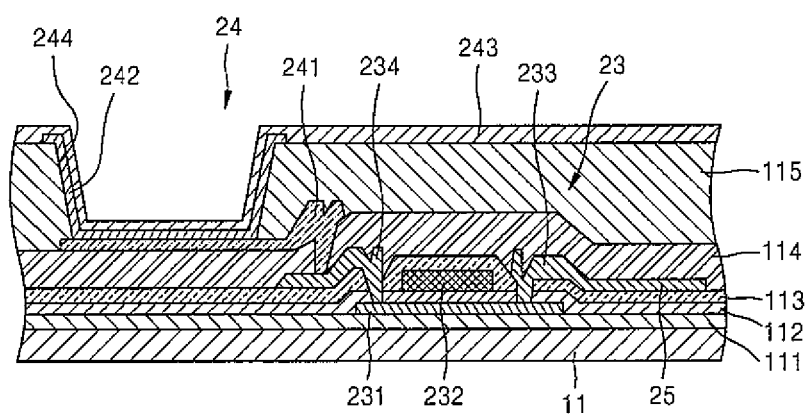
FIG. 6 is a cross-sectional view taken along line III-III' of FIG. 3.

As shown in FIGS. 3, 5, and 6, a buffer layer 111 formed of $SiO_2$ is disposed on a substrate 11 formed of a glass material, and the first TFT 21, the second TFT 23, the capacitor 22, and the OLED 24 are disposed on the buffer layer 111.

As shown in FIGS. 3 and 5, the first TFT 21 includes a first active layer 211 formed on the buffer layer 111, a gate insulating layer 112 formed on the first active layer 211, and a gate electrode 212 on the gate insulating layer 112.

The first active layer 211 may be formed as an amorphous silicon thin film or a polycrystalline silicon thin film. The first active layer 211 includes a source region and a drain region that are respectively doped with N-type and P-type impurities at a high concentration. The first active layer 211 may be formed of an oxide semiconductor. For example, the oxide semiconductor may include a material selected from metal elements of Groups 12, 13, and 14, such as zinc (Zn), indium (In), gallium (Ga), tin (Sn), cadmium (Cd), germanium (Ge), or hafnium (Hf), and combinations thereof. For example, the oxide semiconductor may be formed of G-I-Z-O[$(In_2O_3)$a$(Ga_2O_3)$b$(ZnO)$c] (where a, b, and c are real numbers which satisfy conditions of a≥0, b≥0, and c>0).

The gate insulating layer 112 formed of $SiO_2$ is disposed on the first active layer 211, and the gate electrode 212 is formed on a set or predetermined region of the gate insulating layer 112 by using a conductive layer, such as MoW or Al/Cu. The gate electrode 212 is connected to the gate line 26 via which TFT turn-on/turn-off signals are applied.

An interlayer dielectric layer 113 is formed on the gate electrode 212, and the interlayer dielectric layer 113 is formed to have contact holes, through which a source electrode 213 and a drain electrode 214 contact the source region and the drain region of the first active layer 211 respectively. The source electrode 213 is connected to the data line 27 to provide the first active layer 211 with the data signal, and the drain electrode 214 is connected to a first charging electrode 221 of the capacitor 22 to provide the capacitor 22 with electrical power.

A passivation layer 114 formed of $SiO_2$ or SiNx is formed on the source electrode 213 and the drain electrode 214, and a planarization layer 115 formed of acrylic-based material, polyimide, or benzocyclobutene (BCB) is formed on the passivation layer 114.

The capacitor 22 is located between the first TFT 21 and the second TFT 23 for storing a driving voltage that is necessary to drive the second TFT 23 for one frame. In addition, as shown in FIGS. 3 and 5, the capacitor 22 may include the first charging electrode 221 connected to the drain electrode 214 of the first TFT 21, a second charging electrode 222 formed on the first charging electrode 221 to overlap with the first charging electrode 221 and electrically connected to the driving power line 25 via which the driving power is applied, and the interlayer insulating (dielectric) layer 113 disposed between the first charging electrode 221 and the second charging electrode 222. The structure of the capacitor 22 is not limited thereto, and, for example, the silicon thin film of a TFT and the conductive layer of a gate electrode may be used as the first and second charging electrodes 221 and 222, or a gate insulating layer may be used as a dielectric layer.

As shown in FIGS. 3 and 6, a second active layer 231 is formed on the buffer layer 111 as an amorphous silicon thin film or a polycrystalline silicon thin film, and the second active layer 231 includes a source region and a drain region that are doped with N-type or P-type impurities at a high concentration. The second active layer 231 may be formed of an oxide semiconductor. For example, the oxide semiconductor may include a material selected from metal elements of Groups 12, 13, and 14, such as zinc (Zn), indium (In), gallium (Ga), tin (Sn), cadmium (Cd), germanium (Ge), hafnium (Hf), or a combination thereof. For example, the oxide semiconductor may be formed of G-I-Z-O[$(In_2O_3)$a$(Ga_2O_3)$b$(ZnO)$c] (where a, b, and c are real numbers which satisfy conditions of a≥0, b≥0, and c>0).

A gate electrode 232 that is connected to the first charging electrode 221 of the capacitor 22 via the gate insulating layer 112 to supply the TFT turning-on/turning-off signals is formed on the second active layer 231. A source electrode 233 connected to the driving power line 25 to provide the second active layer 231 with a reference voltage and a drain electrode 234 connecting the second TFT 23 to the OLED 24 in order to apply a driving voltage to the OLED 24 are formed on the gate electrode 232. An interlayer dielectric layer 113 is disposed between the gate electrode 232 and the source and drain electrodes 233 and 234. The passivation layer 114 is disposed between the source and drain electrodes 233 and 234 and a first electrode 241 that is an anode of the OLED 24.

An insulating planarization layer 115 is formed of acrylic-based material on the first electrode 241, and an opening 244 is formed in the insulating planarization layer 115 to expose a portion of the first electrode 115. In addition, an emission layer 242 and a second electrode 243 are formed on the first electrode 115 to complete the manufacturing of the OLED 24.

The OLED 24 emits red, green, and blue light according to the flow of electric current to display a set or predetermined image information. The OLED 24 includes the first electrode 241 that is the anode connected to the drain electrode 234 of the second TFT 23 and receives a positive electrical power from the drain electrode 234, the second electrode 243 that is a cathode configured to cover all the pixels to supply negative electric power, and the emission layer 242 disposed between the first and second electrodes 241 and 243 to emit light.

The first electrode 241, that is, the anode, may be formed as a transparent electrode, using a suitable material such as indium tin oxide (ITO), and the second electrode 243, that is, the cathode, may be formed by depositing Al/Ca on an entire surface of the panel 200 in a case where the organic light emitting display apparatus is a bottom emission display apparatus that emits light toward the substrate 11. The second electrode 243 may be formed of a transparent material, for example, a thin semi-transmissive film formed of a metal material such as Mg—Ag, and transparent ITO may be deposited thereon, in a case where the organic light emitting display apparatus is a top emission display apparatus that emits light toward an encapsulation member 12 that faces the substrate 11. The second electrode 243 may not be deposited on the entire surface of the panel 200, but may be formed to have various suitable patterns. In addition, the first electrode 241 and the second electrode 243 may be formed on opposite sides to what is shown in FIG. 6.

The emission layer 242 may include low-molecular weight organic materials or polymer organic materials. When the emission layer 242 is formed of a low-molecular weight organic material, the emission layer 242 may include a hole injection layer (HIL), a hole transport layer (HTL), an emission layer (EML), an electron transport layer (ETL), and an electron injection layer (EIL) in a single or multiple-layered structure, and examples of suitable organic materials may include copper phthalocyanine (CuPc), N,N'-Di(naphthalene-1-yl)-N,N'-diphenyl-benzidine (NPB), and tris-8-hydroxyquinoline aluminum ($Alq_3$). The low-molecular weight organic materials may be deposited by a vacuum deposition method.

When the emission layer 242 is formed of a polymer organic material, the emission layer 242 may include a structure in which an HTL and an EML are stacked. The HTL may be formed of poly-(2,4)-ethylene-dihydroxy thiophene (PEDOT), and the EML may be formed of polymer organic materials, such as polyphenylene vinylene (PPV) or polyfluorene, by using an inkjet printing method or a screen printing method.

For example, the emission layer 242 may be formed in each of the sub-pixels that emit red, green, and blue light respectively and form one unit pixel. Otherwise, the emission layer 242 may be formed commonly throughout all the sub-pixels, without depositing a light emitting material separately on each of the sub-pixels. Here, the emission layer 242 may be formed by vertically stacking or combining layers including the light emitting materials emitting the red light, green light, and blue light respectively. Other colors may be used provided that white light may be emitted. Also, a color conversion layer or a color filter for converting the white light into light of a set or predetermined color may be further formed.

In addition, an encapsulation member for protecting the screen portion 200a from moisture or air may be provided on the second electrode 243. The encapsulation member may be an insulating substrate formed of a glass material or a thin film encapsulation layer.

If the encapsulation member is a thin film encapsulation layer, the encapsulation member may be formed as a single-layered or a multi-layered structure including an inorganic layer, wherein the inorganic layer may include a metal oxide or a metal nitride. In particular, the inorganic layer may include at least one of $SiN_x$, $Al_2O_3$, $SiO_2$, and $TiO_2$. An uppermost layer of the encapsulation member may be formed as an inorganic layer for preventing moisture from infiltrating into the screen portion 200a. In addition, the encapsulation member may include at least one sandwich structure, in which at least one organic layer is inserted between at least two inorganic layers. In addition, the encapsulation member may include at least one sandwich structure, in which at least one inorganic layer is inserted between at least two organic layers. The encapsulation member may include a first inorganic layer, a first organic layer, and a second inorganic layer from the upper portion of the screen portion 200a. Also, the encapsulation member may include a first inorganic layer, a first organic layer, a second inorganic layer, a second organic layer, and a third inorganic layer sequentially formed from the upper portion of the screen portion 200a. Otherwise, the encapsulation member may include a first inorganic layer, a first organic layer, a second inorganic layer, a second organic layer, a third inorganic layer, a third organic layer, and a fourth inorganic layer sequentially formed from the upper portion of the screen portion 200a, and may further include a metal halide layer (including LiF) between the screen portion 200a and the first inorganic layer. The metal halide layer may prevent damage to the screen portion 200a when the first inorganic layer is formed in a sputtering method or a plasma deposition method. The first organic layer has a less area than that of the second inorganic layer, and the second organic layer may have a less area than that of the third inorganic layer. Also, the first organic layer is completely covered by the second inorganic layer, and the second organic layer may be completely covered by the third inorganic layer. The organic layer may be formed of a polymer material, for example, formed of one selected from polyethylene terephthalate, polyimide, polycarbonate, epoxy, polyethylene, and polyacrylate. For example, the organic layer may be formed of polyacrylate, in more detail, may be formed of a polymerizable monomer composition including diacrylate-based monomer and triacrylate-based monomer. The monomer composition may further include monoacrylate-based monomer. Also, the monomer composition may further include a photoinitiator, such as TPO; however, the present invention is not limited thereto.

In the organic light emitting display apparatus having the above structure, the scan signals are applied to the gate lines 26 of the pixel wirings via the first and second wiring portions 210 and 220, and corresponding signals are applied to the driving power lines 25 and the data lines 27 of the pixel wirings via the first and second pad portions 200c and 200d. In addition, the first wiring portion 210 and the second wiring portion 220 are separately disposed on one portion (upper or first side portion) and the other portion (lower or second side portion) of the panel 200, and thus, the width of the non-screen portion 200b occupied by the first and second wiring portions 210 and 220 may be reduced, and accordingly, the screen portion 200a may be realized as a large size screen. Also, the driving power lines 25 and the data lines 27 are separately connected to the first pad portion 200c and the second pad portion 200d, and thus, the width of the non-screen portion 200b may be further reduced.

Figure 7:
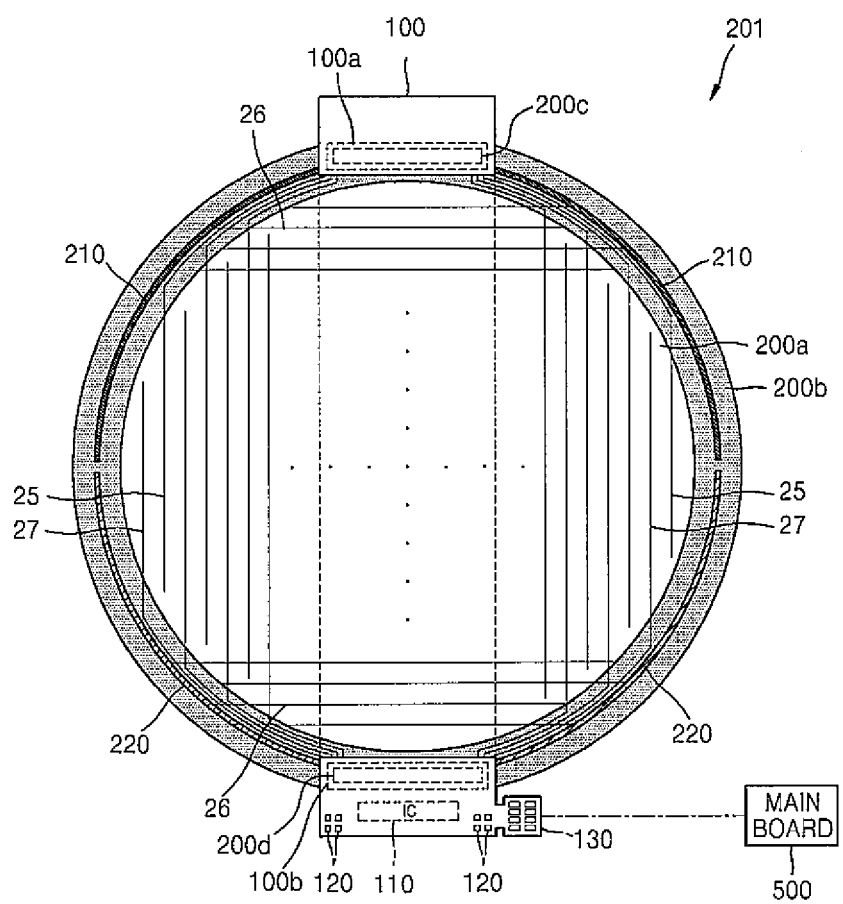
FIG. 7 is a diagram of an organic light emitting display apparatus according to another embodiment of the present invention.

In the above embodiment, a planar shape of the panel 200 is formed as a square; however, a circular panel 201 shown in FIG. 7 may be used. That is, the shape of the panel 200 is not limited to a certain one, but may be modified variously.

Figure 8:
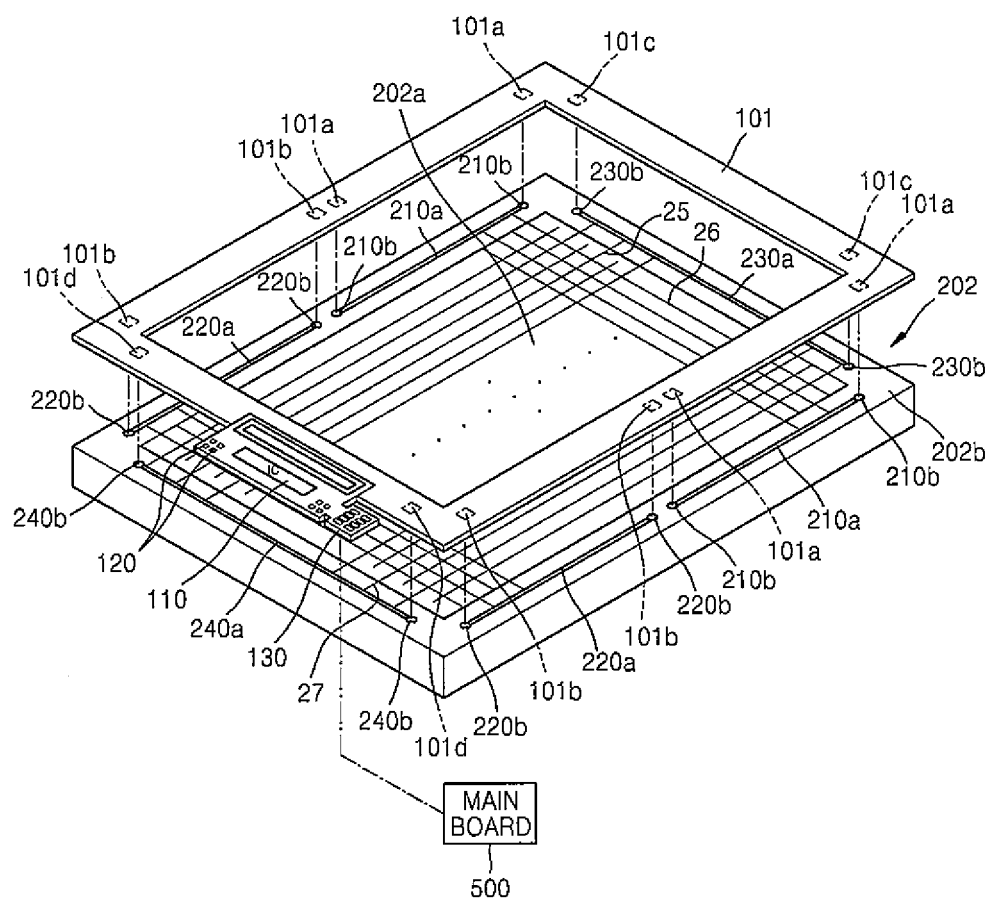
FIG. 8 is a diagram of an organic light emitting display apparatus according to another embodiment of the present invention.

Also, according to the embodiment shown in FIG. 1, the film substrate 100 is attached to the rear surface of the panel 200, and the connection portions 100a and 100b at the opposite ends of the film substrate 100 are bent toward the front surface of the panel 200 and connected to the first and second pad portions 200c and 200d. However, as shown in FIG. 8, a film substrate 101 may be attached to a front surface of a panel 202, where a screen portion 202a is seen. That is, the film substrate 101 is attached to a non-screen portion 202b surrounding the screen portion 202a to electrically connect the main board 500 and the panel 202 to each other. First and second wiring portions 210a and 220a are connected to the gate lines 26, and a third wiring portion 230a is connected to the driving power lines 25 and a fourth wiring portion 240a is connected to the data lines 27. First through fourth connection portions 101a, 101b, 101c, and 101d connected to the first through fourth wiring portions 210a, 220a, 230a, and 240a, respectively, are formed on the film substrate 101. The first connection portion 101a is connected to the first pad portion 210b of the first wiring portion 210a, the second connection portion 101b is connected to the second pad portion 220b of the second wiring portion 220a, the third connection portion 101c is connected to the third pad portion 230b of the third wiring portion 230a, and the fourth connection portion 101d is connected to the fourth pad portion 240b of the fourth wiring portion 240a. As described above, the surface of the panel 202 (e.g., the shape of the panel 202), to which the film substrate 101 is attached, may be changed.

In the modified embodiment, since the wiring portions to be connected to the pixel wirings are separately disposed, the width of the non-screen portion may be reduced, and thus, the organic light emitting display apparatus that has a large size screen may be obtained.

As described above, according to the one or more of the above embodiments of the present invention, a size of the dead space formed on an outer portion of the panel for the wirings may be effectively reduced, and accordingly, a display apparatus that has a large size screen may be formed.

It should be understood that the example embodiments described therein should be considered in a descriptive sense only and not for purposes of limitation. Descriptions of features or aspects within each embodiment should typically be considered as available for other similar features or aspects in other embodiments.

While one or more embodiments of the present invention have been described with reference to the figures, it will be understood by those of ordinary skill in the art that various changes in form and details may be made therein without departing from the spirit and scope of the present invention as defined by the following claims, and equivalents thereof.

What is claimed is:

1. An organic light emitting display apparatus comprising:
    a panel comprising a screen portion on which images are displayed and a non-screen portion surrounding the screen portion;
    a first wiring portion and a second wiring portion on different locations of the non-screen portion, each configured to be connected to pixel wirings on the screen portion;
    a first pad portion and a second pad portion at opposite sides of the non-screen portion facing each other across the screen portion, and connected to the first wiring portion and the second wiring portion respectively;
    a single film substrate comprising a plurality of connection portions connected to the first wiring portion and the second wiring portion through the first pad portion and the second pad portion, the plurality of connection portions on the first pad portion and the second pad portion at the opposite sides of the non-screen portion facing each other across the screen portion; and
    a main board configured to connect the film substrate to an electric power.

2. The organic light emitting display apparatus of claim 1, wherein:
    the first wiring portion is connected to the pixel wirings at a first side portion of the screen portion; and
    the second wiring portion is connected to the pixel wirings at a second side portion of the screen portion separated from the first side portion of the screen portion.

3. The organic light emitting display apparatus of claim 1, wherein the pixel wirings comprise gate lines via which a scan signal to each of a plurality of pixels in the screen portion is applied.

4. The organic light emitting display apparatus of claim 3, wherein the pixel wirings further comprise data lines and driving power lines configured to be connected to the film substrate, not through the first wiring portion and the second wiring portion, to apply a data signal and a driving power signal to each of the pixels.

5. The organic light emitting display apparatus of claim 1, wherein the first pad portion and the second pad portion are on a first surface of the panel, in which the screen portion is seen, and the film substrate is attached to a second surface of the panel facing oppositely away from the first surface.

6. The organic light emitting display apparatus of claim 1, wherein the first wiring portion and the second wiring portion are on a first surface of the panel, in which the screen portion is seen, and the film substrate is attached to the non-screen portion of the panel on the first surface and configured to be connected to the first wiring portion and the second wiring portion via the connection portions.

7. The organic light emitting display apparatus of claim 6, further comprising a third wiring portion and a fourth wiring portion configured to be connected to the connection portions of the film substrate on the first surface of the panel.

8. The organic light emitting display apparatus of claim 7, wherein the pixel wirings comprise gate lines configured to be connected to the first wiring portion and the second wiring portion to apply scan signals to pixels in the screen portion, data lines configured to be connected to the third wiring portion to apply data signals to the pixels, and driving power lines configured to be connected to the fourth wiring portion to apply driving voltage signals to the pixels.

9. The organic light emitting display apparatus of claim 1, further comprising:
    a driving chip on the film substrate.

10. The organic light emitting display apparatus of claim 9, further comprising:
    a driving component selected from a resistor and a capacitor on the film substrate.

11. The organic light emitting display apparatus of claim 1, wherein the panel is formed in a square shape or a circular shape.

* * * * *